Figure 1:
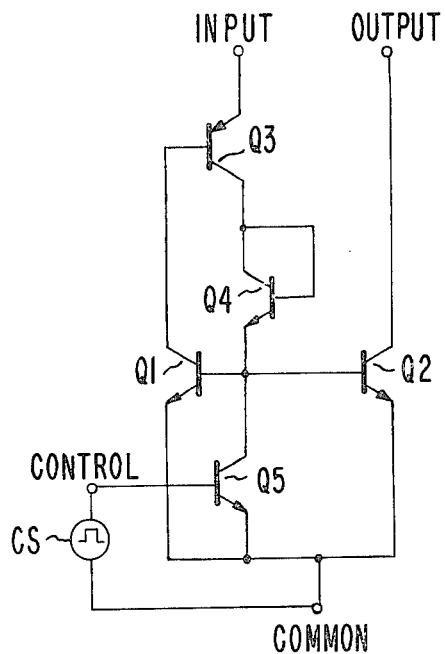

United States Patent [19]
Ahmed

[11] 4,119,924
[45] Oct. 10, 1978

[54] SWITCHABLE CURRENT AMPLIFIERS

[75] Inventor: Adel Abdel Aziz Ahmed, Annandale, N.J.

[73] Assignee: RCA Corporation, New York, N.Y.

[21] Appl. No.: 830,858

[22] Filed: Sep. 6, 1977

[51] Int. Cl.$^2$ ............................................. H03F 3/04
[52] U.S. Cl. ..................................... 330/288; 307/255
[58] Field of Search ............... 330/278, 288; 307/296, 307/297, 255; 323/4

[56] References Cited

U.S. PATENT DOCUMENTS 3,900,790  8/1975  Ohsawa ........................... 307/297 X

OTHER PUBLICATIONS

Gersbach, "Current Source With Alpha Compensation," *IBM Technical Disclosure Bulletin,* vol. 19, No. 8, Jan. 1977, pp. 2949–2950.

Hirschfeld, "The Miser – An IC Stored Energy Regulator," *Electronic Products Magazine,* Nov. 15, 1971, pp. 54–56.

*Primary Examiner*—James B. Mullins
*Attorney, Agent, or Firm*—H. Christoffersen; Allen LeRoy Limberg; Richard G. Coalter

[57] ABSTRACT

A current amplifier has its input terminal connected to the collector electrode of its master transistor by the forward-biased emitter-base junction of a complementary conductivity input transistor. This input transistor has its collector electrode connected with potential offset to the base electrode of the master transistor. The complementary conductivity transistor tends to operate in saturation, completing a collector-to-base feedback connection for the master transistor that regulates its emitter-to-base potential to its collector-to-emitter path to conduct substantially all the applied input current. A similar emitter-to-base potential is applied to a slave transistor having its collector electrode connected to the output terminal of the current amplifier and demanding a collector current as output current proportionally related to the input current. The current mirror amplifier operation is readily disabled by diverting the collector current of the input transistor away from the base electrode of the master transistor.

8 Claims, 3 Drawing Figures

4,119,924

SWITCHABLE CURRENT AMPLIFIERS

The present invention relates to current amplifiers.

A current mirror amplifier (CMA) is a current amplifier, the current gain of which is determined by the ratio of the collector current versus voltage characteristic of a slave transistor to that of a master transistor. The master transistor is conditioned by collector-to-base feedback to conduct, via its collector-to-emitter path, substantially all the input current to the CMA. An emitter-to-base potential is applied to the slave transistor which is substantially equal to the emitter-to-base potential of the master transistor, conditioning the slave transistor to conduct, via its collector-to-emitter path, the output current of the CMA.

CMA's may also be constructed using enhancement mode field effect transistors (FET's) with the connections of their gate, source and drain electrodes being analogous to the base, emitter and collector connections, respectively, of the bipolar transistors they replace. P-channel and N-channel FET's are considered to be similar in conductivity type to PNP and NPN transistors, respectively.

The present invention is embodied in a CMA in which input current is applied between the emitter (or source) electrode of the master transistor and the emitter electrode of an input transistor of complementary conductivity type to the master transistor. This input transistor has the collector (or drain) electrode of the master transistor connected to its base electrode and has its collector electrode connected — e.g., via potential offsetting means—to the base (or gate) electrode of the master transistor. Such a current amplifier is readily disabled by diverting the collector current of the input transistor from the base (or gate) electrode of the master transistor.

Figure 2:
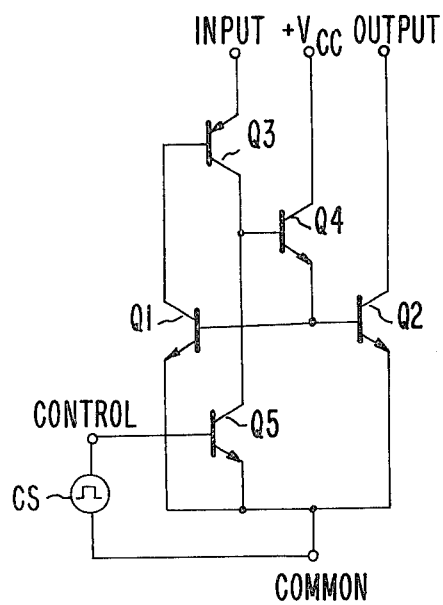
Figure 3:
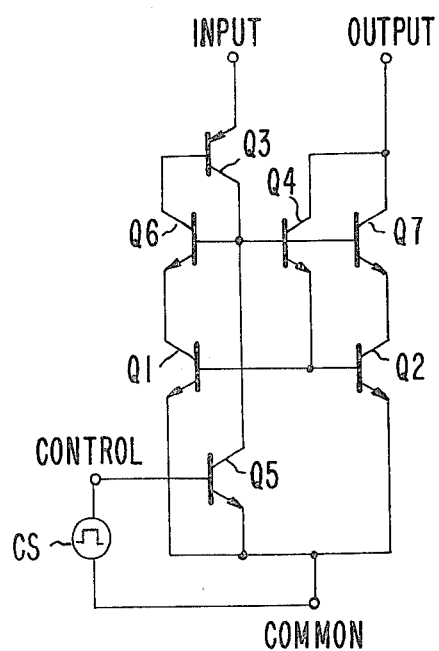

In the drawing:

FIGS. 1, 2 and 3 are schematic diagrams of CMA's, each of which embodies the present invention.

In the CMA of FIG. 1, Q1, Q2 and Q3 are the master, slave and input transistors, respectively. The input terminal of the FIG. 1 CMA is at the emitter electrode of Q3; its common terminal is at an interconnection between the emitter electrodes of Q1 and Q2; and its output terminal is at the collector electrode of Q2. The collector electrode of Q1 is connected to the base electrode of Q3, and the collector electrode of Q3 is connected to an interconnection between the base electrodes of Q1 and Q2. These connections of Q1 and Q3 in a regenerative feedback loop cause them to increase their conduction. The increase is limited by the emitter current made available to Q3 by applying input current to the input terminal of the CMA. When this limit is reached, at least one of the transistors Q1 and Q3 saturates.

Potential offsetting means—e.g., the self-biased transistor Q4—is inserted into the connection between the collector electrode of Q3 and the base electrode of Q1, to cause input transistor Q3 to saturate while master transistor Q1 is still operating in the normal mode. This forces the common-emitter forward current gain, $\beta_{Q3}$, of the saturated transistor Q3 to be reduced, while the common-emitter forward current gain, $\beta_{Q1}$, of Q1 remains at normal level. The value of $\beta_{Q3}$ falls to $1/(\beta_{Q1} + \beta_{Q2})$, where $\beta_{Q2}$ is the common-emitter forward current gain of the slave transistor Q2. Substantially all the input current applied to the input terminal of the CMA flows through the emitter-base junction of Q3 and the collector-to-emitter path of Q1 and out of the common terminal of the CMA. The regenerative loop connection of Q1 and Q3 adjusts the emitter-to-base potential of Q1 to condition it to conduct this current flow, substantially equal to the CMA input current. The application of like emitter-to-base potential to Q2 conditions it to demand a collector current at the output terminal of the CMA proportional to the input current in substantially the same ratio as that between the collector current versus emitter-to-base potential characteristic of Q2 and that of Q1.

The CMA operation thusfar described is readily disabled, causing the CMA neither to accept input current nor to demand output current, by diverting the collector current of either of transistors Q1 or Q3 from the base electrode of the other. This is most easily done by diverting current from the base electrode of that one of transistors Q1 and Q3 having its emitter electrode connected to a fixed potential; generally this is Q1 with its emitter electrode at the common terminal of the CMA. In FIG. 1, the collector current of Q3 flows through self-biased transistor Q4 and is diverted selectively from the base electrodes of Q1 and Q2 when transistor Q5, having its emitter electrode connected to the common terminal of the CMA, is biased into conduction by application of forward base current via a control terminal from a control signal generator, CS.

In the FIG. 2 CMA, current is diverted from the collector electrode of Q3 prior to the offset in potential to the base electrode of Q1, whenever Q5 is biased into conduction by control signal generator CS. FIG. 2 also shows an alternative connection of the collector electrode of Q4, to a positive operating potential as referred to the potential at the common terminal of the CMA, which operating potential is larger than the emitter-to-base voltage of Q1 and Q2 plus the saturation emitter-to-collector voltage of Q4. Either connection of the collector electrode of Q4 may be used with either connection of the collector electrode of Q5. With either connection of the Q4 collector electrode, Q4 is conditioned for operation in the normal mode of transistor operation.

FIG. 3 shows a modification of the FIG. 2 CMA in which the collector electrode of Q4 is connected to the OUTPUT terminal rather than to $+V_{CC}$. Common-base amplifier transistor Q6 connects the collector electrode of Q1 to the base electrode of Q3 and so forms a cascode connection with Q1. Common-base amplifier transistor Q7 connects the collector electrode of Q2 to the OUTPUT terminal and so forms a cascode connection of Q2. The base electrodes of Q6 and Q7 are connected to the same potential, between the base potential of Q3 and the potential at the base electrodes of Q1 and Q2, to place equal collector potentials on Q1 and Q2 and improve the tracking between their respective collector current versus emitter-to-base potential characteristics. The base electrodes of Q6 and Q7 are most conveniently biased to a point in the means used to offset the collector potential of Q3 from the potential at the base electrodes of Q1 and Q2. In FIG. 3, the base electrodes of Q6 and Q7 are biased by the base potential of Q4, the base-emitter junction of Q4 serving as the means to offset the collector potential of Q3 from the base potentials of Q1 and Q2.

Various modifications of the CMA's described supra will, in light of this disclosure, suggest themselves to one skilled in the art of circuit design, and the scope of the claims is to be construed accordingly. For example, either or both of transistors Q4 and Q5 may be replaced by a field effect transistor without departing from the spirit and teaching of the invention. Either of the switches CMA's shown in FIGS. 1 and 2 can be connected to provide direct-coupled emitter-to-base feedback for a further transistor. This stabilizes the transistor base-to-collector current gain, causing it to be substantially equal to the reciprocal of the switched CMA gain when it is enabled, and degenerates the base-to-collector current gain of the transistor to zero when the switched CMA is disabled. Either of the CMA's shown in FIGS. 1 or 2 may have another output terminal at the collector electrode of a further transistor which has its base-emitter junction parallelling that of Q2. Q1 and Q2 may be provided with respective emitter degeneration resistors having respective conductances related in similar ratio to the respective areas of the base-emitter junctions of the transistors to which they connect. Or just one of Q1 and Q2 may be provided with an emitter degeneration resistor to provide for a modified CMA structure.

What is claimed is:

1. A current amplifier comprising:
   first and second transistors of a first conductivity type and a third transistor of a second conductivity type complementary to the first, each of said transistors having first and second electrodes and a principal conduction path therebetween and having a third or control electrode, the flow of current through its principal conduction path being controlled responsive to respective control voltages between its first and third electrodes, said third transistor being a bipolar type having emitter and collector and base electrodes corresponding to its first and second and third electrodes, respectively, and having an emitterbase junction;
   means for operating said third transistor in saturation, so its base current is substantially as large as its emitter current, including means for direct coupling the second electrode of said first transistor to the base electrode of said third transistor,
   means for direct coupling the collector electrode of said third transistor to the third electrode of said first transistor with an offset potential greater than any afforded between the second electrode of said first transistor and the base electrode of said third transistor by said means for direct coupling the second electrode of said first transistor to the base electrode of said third transistor, and
   means not including any of the foregoing elements for supplying an input current of prescribed value between the first electrode of said first transistor and the emitter electrode of said third transistor; and
   means for applying as the control potential of said second transistor a potential equal to the control potential of said first transistor appearing responsive to said input current, responsive to which said second transistor is conditioned to conduct an output current between its first and second electrodes.

2. A current amplifier comprising:
   input, output and common terminals;
   first and second transistors of a first conductivity type and a third transistor of a second conductivity type complementary to said first conductivity type, each of said transistors having base and emitter and collector electrodes;
   first and second galvanic connections between the emitter electrodes of said first and said second transistors respectively and said common terminal;
   a third galvanic connection between the collector electrode of said second transistor and said output terminal;
   a fourth galvanic connection between said input terminal and the emitter electrode of said third transistor;
   a fifth galvanic connection between the collector electrode of said first transistor and the base electrode of said third transistor; and
   potential offsetting means connecting the collector electrode of said third transistor to an interconnection between the base electrodes of said first and said second transistors, for completing a regenerative latch connection of said first and third transistors in which said third transistor operates in saturation.

3. A current amplifier as set forth in claim 2 in combination with means for selectively disabling said current amplifier including:
   means for selectively diverting the collector current of said third transistor from the base electrode of said first transistor.

4. A current amplifier as set forth in claim 3 wherein said means for selectively diverting includes:
   a fourth transistor of said first conductivity type having an emitter electrode connected to said common terminal, having a collector electrode connected to the interconnection between the base electrodes of said first and said second transistors, and having a base electrode; and
   means for selectively applying bias to the base electrode of said fourth transistor to place it into conduction and thus selectively disabling current mirror amplifier action as between said input and output terminals.

5. A current amplifier as set forth in claim 3 wherein said potential offsetting means comprises diode means poled to be forward-biased by the collector current of said third transistor.

6. A current amplifier as set forth in claim 3 including a fourth transistor of said first conductivity type having a base electrode to which the collector electrode of said third transistor is connected, having an emitter electrode connected to said interconnection between the base electrodes of said first and said second transistors, having a base-emitter junction between its base and emitter electrodes included within said potential offsetting means, and having a collector electrode connected to receive a potential conditioning said fourth transistor for normal transistor operation.

7. A current amplifier as set forth in claim 2 wherein said potential offsetting means comprises diode means poled to be forward-biased by the collector current of said third transistor.

8. A current amplifier as set forth in claim 2 including a fourth transistor of said first conductivity type having a base electrode to which the collector electrode of said third transistor is connected, having an emitter electrode connected to said interconnection between the base electrodes of said first and said second transistors, having a base-emitter junction between its base and emitter electrodes included within said potential offsetting means, having a collector electrode connected to receive a potential conditioning said fourth transistor for normal transistor operation, and having a principal conduction path between its emitter and collector electrodes.

* * * * *